United States Patent [19]

Hernandez-Ros et al.

[11] Patent Number: 5,428,888
[45] Date of Patent: Jul. 4, 1995

[54] INTERNAL STRESS RELAXATION METHOD IN MAGNETIC FIELD SENSOR HEAD CORES

[75] Inventors: Claudio A. Hernandez-Ros, Madrid; Ma Carmen S. Trujilio, Majadahonda; Eloisa L. Perez; Pedro S. Sanchez, both of Madrid, all of Spain

[73] Assignee: Alcatel Standard Electrica, S.A., Madrid, Spain

[21] Appl. No.: 176,712

[22] Filed: Jan. 3, 1994

[30] Foreign Application Priority Data

Dec. 31, 1992 [ES] Spain ................... 9202668

[51] Int. Cl.⁶ .............................................. H01F 41/06
[52] U.S. Cl. ...................................... 29/605; 148/108; 148/121
[58] Field of Search ......... 29/605; 148/108 X, 121 X, 148/122, 112, 113; 361/143

[56] References Cited

U.S. PATENT DOCUMENTS 5,032,947 7/1991 Li et al. ................. 361/143

FOREIGN PATENT DOCUMENTS

0464275A1 7/1990 European Pat. Off. ........ C21D 1/40
59027507 2/1984 Japan ............................ H01F 1/16

OTHER PUBLICATIONS

The "Flux-gate magnetometer" by F. Primdahl, published in the J. Phys. E: Sci. Instrum., vol. 12, 1979, p. 241 et. seq.
"Switch capacitor circuits" by Philip E. Allen & Edgar Sanchez-Sinenchio, Van Nostrand Reinhold Company Inc., 135 West 50th Street, N.Y. 10020 USA.
Databook vol. 1, 1989, National Semiconductor, "Data Acquisition Linear Devices", pp. 1-152 to 1-173, dev.: MF8, 4th-Order Switched Capacitor Bandpass Filter.
Databook vol. 2, Texas Instruments, "Linear Circuits", Data Acquisition and Conversion, pp. 2-139 to 2-153, dev.: TLC10/MF10A, TLC20/MF10C, Universal Dual Switched-Capacitor Filter.
B. B. Narod and J. R. Bennest, "An Evaluation of the Noise Performance of Fe, Co, Si, and B Amorphous Alloys in Ring-Core Fluxgate Magnetometers", pp. 1468-1472, Can, J. Phys. vol. 63, 1985.
Donald C. Scouten, "Sensor Noise in Low-Level Flux-Gate Magnetometers", IEEE Transactions on Magnetics, vol. MAG-8, No. 2, Jun. 1972, pp. 223-231.

*Primary Examiner*—Carl E. Hall
*Attorney, Agent, or Firm*—Frishauf, Holtz, Goodman & Woodward

[57] ABSTRACT

A manufacturing process for use in manufacturing magnetic field sensor head cores, comprises: providing a core formed of an amorphous ferromagnetic material on which is placed an insulating layer; mounting, a first winding that functions as a drive coil for the core over said insulating layer; providing second (37) and third (38) coils on said core (31) that respectively function as a sensor and a compensating coil for the sensor head; both the second and third coils being wound in form of a hollow cylinder 36 inside of which is positioned an assembly formed by the core 31 and the drive coil 32; supplying a first electric current to the core 31 of the sensor head, said core heating up as said first current flows through said drive winding, supplying a second and alternating electric current to that the one 38 of compensating and sensor coils 37 and 38 that surrounds the core 31 and functions as the compensating winding 38; monitoring a signal induced in the other coil 37 that functions as the sensor winding as said second alternating current flows through said compensating coil 38; and, then, terminating the flow of the first electric current to the drive coil when a level of the signal induced in the sensor coil 37 abruptly drops in a level thereof, indicating that a Curie temperature of the core has been reached and internal stresses in the core have been relaxed.

6 Claims, 2 Drawing Sheets

INTERNAL STRESS RELAXATION METHOD IN MAGNETIC FIELD SENSOR HEAD CORES

BACKGROUND OF THE INVENTION

Reference to related application, assigned to the Assignee of the present invention, the disclosure of which is hereby incorporated by reference.

U.S. Ser. No. 08/176,701 filed Jan. 3, 1994, B. TAMAYO LOPEZ et al. claiming priority of Spanish application P 9202675.

Reference to related publications:

The "Flux-gate magnetometer" by F. Primdahl, the entire contents of which is incorporated herein by reference, published in the J. Phys. E: Sci. Instrum., vol. 12, 1979, pages 241 et. seq.

"Switch capacitor circuits" by Philip E. Allen & Edgar Sanchez-Sinenchio, Van Nostrand Reinhold Company Inc., 135 West 50th Street, N.Y. 10020 USA.

Databook Volume 1, 1989, National Semiconductor, "Data Acquisition Linear Devices, pages 1-152 to 1-173, dev.: MF8, 4th-Order Switched Capacitor Bandpass Filter; and Databook Volume 2, Texas Instruments, "Linear Circuits" Data Acquisition and Conversion, pages 2-139 to 2-153, dev.: TLC10/MF10A, TLC20/MF10C, Universal Dual Switched-Capacitor Filter.

1. Field of the Invention

This invention concerns a method for relaxing internal stress produced in the core of the a high sensitivity magnetometric sensor during the operation of a coil winding, where the primary or drive winding is wound directly on the core of an amorphous ferromagnetic material covered only by a strip of insulating tape.

This method is applicable to the process of manufacturing high sensitivity magnetometric sensor core heads of the flux-gate type.

2. Background

The use of magnetometric sensors based on the flux-gate principle has been known from the 1950s and, since then, although the basic principle has not changed, great effort has been dedicated to perfecting these devices, especially with respect to noise reduction and boosting sensitivity.

In an article entitled, "The Fluxgate Magnetometer" by F. Primdahl, the entire contents of which is incorporated herein by reference, published in the J. Phys. E: Sci. Instrum., vol. 12, 1979, the fluxgate principle is explained in detail. The basic flux-gate principle is outlined on page 241 of said Primdahl articles.

A sensor using the fluxgate principle as described on page 241 of the Primdahl article comprises a core formed of a magnetic material which has a pick-up coil mounted thereon.

The earth's magnetic field acting in a direction parallel to the core axis will cause a magnetic flux to appear in the core and will also cause an induced voltage to appear across the pick-up coil. Any changes in the permeability of the core will cause the flux in the core to change and the induced voltage in the pick-up coil to change. This change in flux resulting from changes in the core permeability, will induce the voltage to appear across the pick-up coil mounted on the core. The magnitude of change in core permeability depends on the core material used and the geometric shape of the core material.

This basic flux-gate action is based on a time variation of the core permeability. When a magnetic material is saturated, its permeability to further magnetization decreases. The well known hysteresis curves for magnetic materials reflect the fact that the magnetization of the core decreases when the core is saturated. If an alternating voltage or current is applied to the saturated core, then an alternating voltage or current will appear across the pick-up coil.

In the article "Sensor noise in low-level flux-gate magnetometers" by D. C. Scouten, published in the IEEE Transactions on Magnetics review, volume MAG-8 No.2, June 1972, page 228, it is shown how noise is produced through non-alignments in the structure of the core material and that their effect is equivalent to independent magnetic moments that occur inside the core. These non-alignments can be produced, and in fact are produced, by mechanical stress, including direct winding of a coil on the core, during the manufacturing process of the sensor head.

In the article "An Evaluation of the Noise Performance of Fe, Co, Si and B amorphous alloys in ring-core fluxgate magnetometers" by B. B. Narod et al., published by CAN. J. PHYS., volume 63, 1985, on page 1472 it is indicated how major improvements can be achieved in relation to noise characteristics by means of sophisticated methods of core annealing.

At present, the usual, or standard procedure is annealing the unwound core in an oven at a temperature above the Curie temperature, at which the internal stress relax and the nonalignments that produce disoriented magnetic couples disappear, thereby significantly reducing the noise produced by the core in question. The high temperatures normally reached prevent annealing of the core once wound, since the wire or insulation of the enveloping winding could be damaged, unless a special, and much more expensive wire and insulation is employed.

For this reason it has been proposed to wind the coils on coil forms or cylinders that can stand the winding forces and the following manufacturing processes, instead of these having to be supported directly by the core itself.

This means that more electromagnetic energy would be required in order to saturate the core which increases the power consumption.

THE INVENTION

It is an object of the invention to provide a method which relaxes internal stresses in the core material without damaging any coil or coils wound around the core.

Briefly, in accordance with the present invention, a first current is applied to a drive coil mounted on the core and an alternating current is supplied to one of a compensating coil and a sensor coil mounted on the core. A signal is induced and monitored in the other one of the sensor coil and compensating coil mounted on the core as a result of the alternating current flowing through the one of the sensor coil and the compensating coil. Flow of the first current to the core is stopped when an abrupt decline in the current flowing through the one of the compensating and sensor coils is sensed. The abrupt decline indicates that a Curie temperature of the core material has been reached; said abrupt decline further indicating that stresses causes by bending of said core and winding the coils on said core have been relaxed.

DRAWINGS

DETAILED DESCRIPTION

Figure 1:
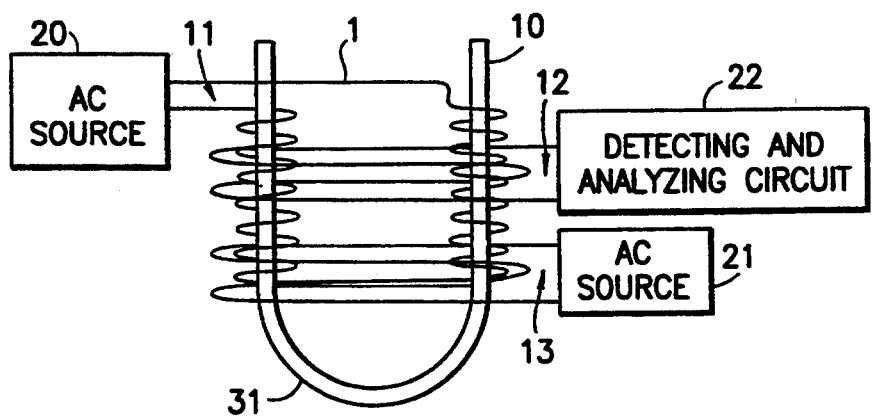
FIG. 1 shows a configuration of the magnetometric sensor having a compensating coil of the type referred to in the invention.

A magnetometric sensor 1 of the flux-gate type has the basic configuration shown in FIG. 1, in which, a core 10 of an amorphous ferromagnetic material, has a drive coil 11 wound thereon. A signal from AC signal source 20 at a predetermined frequency is applied to coil 11, to saturate the core 10 symmetrically.

A sensor coil 12 is wound on core 10 into which is coupled part of the magnetic field existing in the core, in such a way that it is possible to measure an external magnetic field acting on the core 10 as a result of an asymmetry produced in the hysteresis curve of the core 10 by the external magnetic field.

A third compensating coil 13 is mounted on core 10, coil 13 is connected to another AC source 21 that generates a constant magnetic field inside the core 10 in order to cancel the magnetic field of the earth or other, e.g., fixed nearby sources that are present and that interfere with the field that it is actually desired to detect.

Figure 3A:
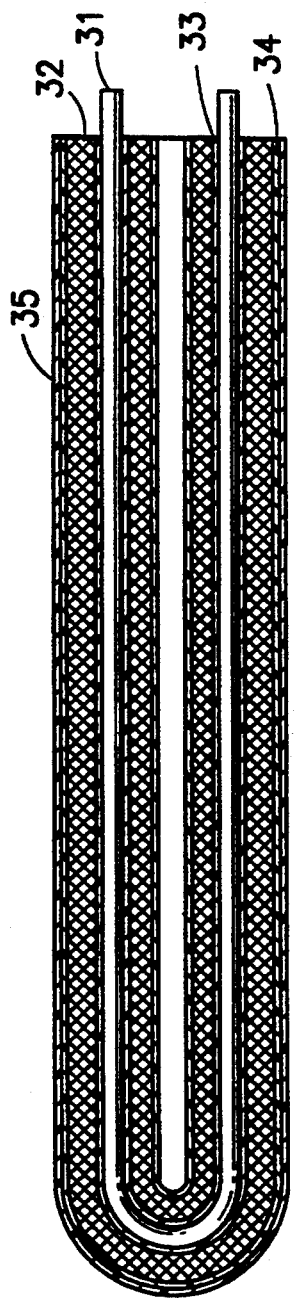
FIGS. 3A and 3B show the structure of a high sensitivity sensor head and the core in which major internal stresses have been created during the manufacturing thereof, and wherein said stresses are relaxed using the method of the invention.
Figure 3B:
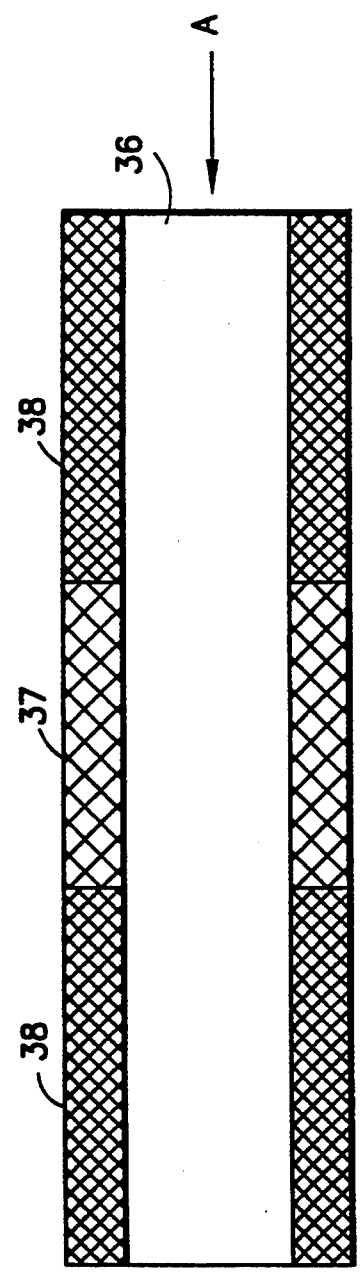

The method of the invention is explained with reference to a sensor head of this type. As can be seen in FIGS. 3A and 3B a core 31 of amorphous ferromagnetic material is covered with a Teflon tape 33 on which is subsequently wound the winding of the drive coil 32. Coil 32 has a teflon tape 34 thereon. The assembly is bent in a middle portion thereof in order to form a U-structure or a structure equivalent to that of a ring. Another Teflon tape 35 is wound over tape 34 to hold the structure together.

Both of the processes mentioned, winding and bending, produce stresses in the core material, giving rise to a core 31 that, in a sensor head generates noise, and which has a response that is not very linear and has a reduced dynamic range. The sensor head formed in this way, is not suitable for oven-annealing as the drive coil could be damaged due to the high temperatures.

Figure 2:
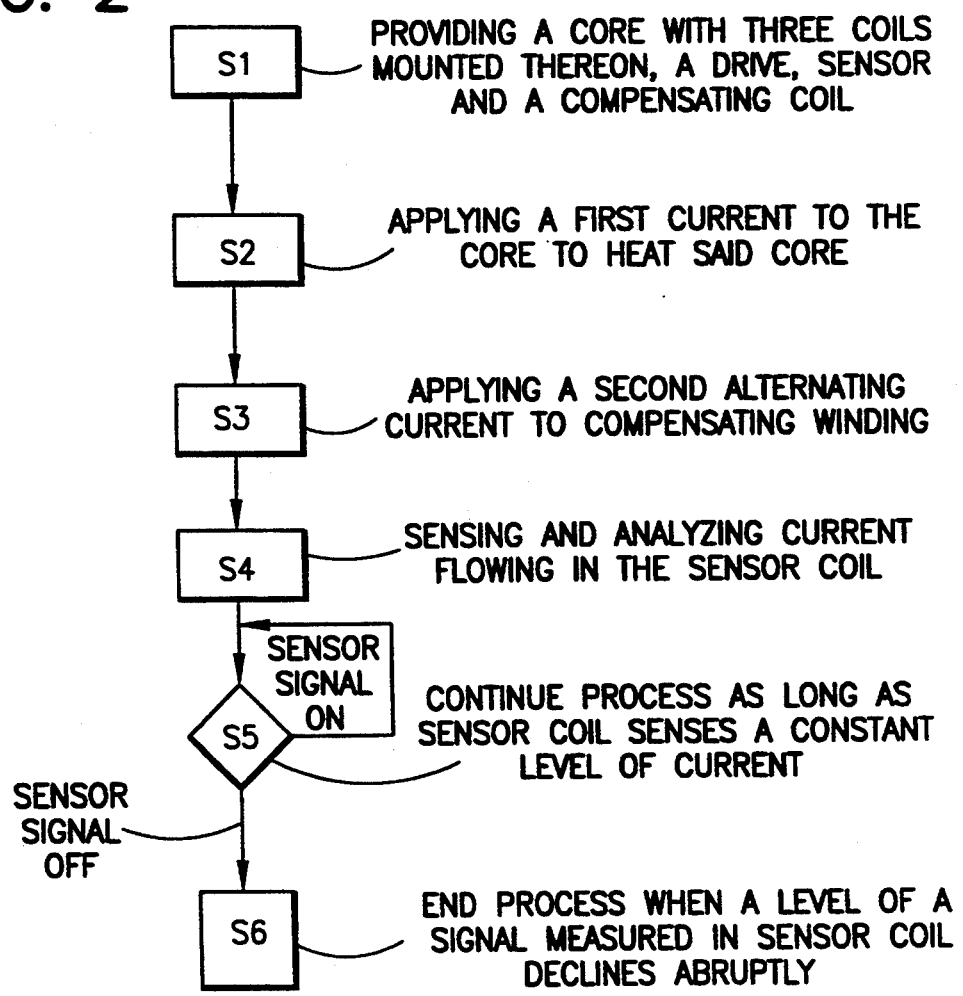
FIG. 2 is a flowchart of the annealing method for relaxing the stresses in the core material, in accordance with the invention.

Referring to FIG. 2 in step S1, the sensor is assembled by a sliding and fitting of the structure so formed and shown in FIG. 3A as schematically shown by arrow A of FIG. 3B, carefully into the cylinder form 36 shown in FIG. 3B. Cylinder form 36 is hollow and is formed by, or has wound thereon, the sensor coil 37 and the compensating coil 38. The magnetometric sensor 10 thus is formed by the complete assembly of the core 31, drive coil 32, teflon tapes, inside cylinder 36. Once the magnetometric sensor head 1 has been completed, step S1 of FIG. 2, annealing of the core of this head takes place. In Step S2 of (FIG. 2) a first electric current is applied to the core 31 to heat the core 31 by resistance heating that is, as a result of its inherent electrical losses. In step S3, an alternating electric current is applied to the compensating coil 38, creating a magnetic field in the core 31 of the sensor head. The signal from sensor coil 37 is monitored and analyzed, (see step S4) as long as the signal from coil 37 is constant or ON and heating of core 31 continue. In step S5, when the signal from sensor coil 37 is cancelled, or OFF it means that the Curie temperature of the core 31 has been exceeded and consequently the internal stresses have been relaxed, at which point the process is concluded, (step S6 of FIG. 2).

In general, the method for releasing internal stresses which exist in a sensor head core 10 used in the magnetic field sensor device described above, as shown in the flowchart in FIG. 2 comprises the steps of: step S1 forming a sensor head core 31 of FIG. 3A from an amorphous ferromagnetic material; providing an insulating layer 33 over said core 31; winding a drive coil 32 having a teflon tape 34 thereon over said drive coil 32; winding a second sensor winding 37 and a third, compensating winding 38 into a hollow cylinder 36 form or coil form such that said second and third windings are insulated from said drive coil (32 of FIG. 3A) and from each other; inserting said core with said drive winding 32 wound thereon into an interior of said coil form or cylinder 36; step S2 comprises supplying a first electric current to the core that is formed of the amorphous ferromagnetic material, said first current heating said core 31 due to inherent electrical losses by resistance heating, that is, resulting from imperfections in a structure of said core 31; in step S2, applying an alternating current via either of said second or third winding that functions as the compensating winding for said core 31; in step S3 an alternating electric current is applied to that one of the second and third coils that functions as the compensating coil; in step S4; monitoring a signal induced in the other one (37) of said second or third winding forming said coil form or cylinder 36; in step S4, a magnetic field created inside said core 31 by said alternating current flowing through said second, or third winding; and (step S5 and S6) discontinue a current flow to drive coil 32 and the compensating coil 38 that functions as said compensating coil mounted on said core 31. In step S4, the signal induced in the other coil 37 that functions as the sensor coil is monitored until an abrupt decline in a level thereof is sensed, said abrupt decline being indicative of an internal stress relaxation in said amorphous ferromagnetic core material; in step S5, the sensor coil 37 output signal is monitored until the abrupt decline therein is in a level thereof is sensed; in step S6, after the abrupt decline in the sensor signal level is sensed, the current to the drive coil 32 is discontinued, the current flow and the alternating current being supplied to the compensating coil 38 can also be discontinued.

Referring again to FIG. 1, a second sensor coil 12 is wound on the core (10, 31), for sensing at least part of a magnetic field that is produced in the core (10, 31) by the second alternating current provided by AC source 21 in such a way that it is possible to measure an external magnetic field acting on the core (10, 31) by measuring an asymmetry produced in a hysteresis curve of the core (10, 31).

The compensating coil 13 serves to generate a constant magnetic field inside the core 31 that cancels the magnetic field generated by the earth or by other nearby magnetic sources that are present in a fixed manner and that might mask the field that it is actually desired to detect.

When a magnetic field is present, the distorted signal at the output of the sensor head 4 is not symmetrical, so that harmonics are included therein. A second harmonic of the output of said sensor thus becomes different from zero.

Various changes and modifications may be made, and features described in connection with any one of the embodiments may be used with any of the others, within the scope of the inventive concept.

I claim:

1. A method for relaxing internal stresses which exist in a sensor head core (31) used in a magnetic field sensor device, comprising the steps of:

providing a sensor head core (31) that is formed of an amorphous ferromagnetic material;

providing an insulating layer (33) over said core;

winding a first drive coil (32) having another insulating layer 34 provided therein over said insulating layer (33);

winding a second coil forming a sensor winding (37) and a third coil (38) forming a compensating winding to have a hollow cylinder form (36) such that said second and third coils are insulated from said drive coil (32) and from each other;

inserting said core (31) with said drive winding (32) wound thereon into a hollow interior of said cylinder form (36);

supplying a first electric current from a current source (20) to said core (31) for heating said core (31) by resistance heating due to inherent electrical losses in said core (31);

applying a second and alternating current from an AC current source (21) to one (38) of said second and third coils (37, 38);

monitoring a signal induced in the other winding (37) of said third and second coils (37, 38) that senses the magnetic field created inside said core (31) by said second and alternating current flowing through said one coil (38); and discontinuing the supply of the first electric current to said core (31) when the signal induced in said other coil (37) that functions as a sensor winding abruptly declines in a level thereof, said abrupt decline being indicative of internal stress relaxation in said amorphous ferromagnetic material of the core (31).

2. The method according to claim 1, wherein said step of providing an insulating layer comprises:

providing a teflon tape (33) between said core and said drive winding, and placing another teflon tape (34) directly on said drive winding.

3. The method according to claim 1, further comprising:

providing the core in an essentially straight elongated form; and after winding the drive coil (32) on said core and placing said other insulating layer (34) on the drive winding; then bending the core in a middle portion thereof to form a structure of essentially U, or ring shape, whereby said bending step will create at least some of said internal stresses, in said core (31).

4. The method according to claim 1, wherein the step of discontinuing supply of the first electrical current to the core is initiated when the abrupt decline in said signal induced in said other coil (37) that functions as the sensor winding indicates that a Curie temperature of said amorphous ferromagnetic material of said core has been reached.

5. The method according to claim 1, wherein the second and alternating current is applied to the compensating winding (38) and the induced signal in the sensor winding (37) is monitored.

6. Internal stress relaxation method in a magnetic field sensor having a core (31) of amorphous ferromagnetic material onto which is wound a first winding that constitutes a drive coil (32) separated from the core (31) by insulating means (33), said sensor also having a second winding forming a sensor coil (37) and a third winding forming a compensating coil (38), that are wound to form a cylinder (36) into which is inserted an assembly formed by the core (31) and the drive coil (32) and characterized in that the method comprises the following steps:

application of an electric current (S2) to the core (31) of the amorphous ferromagnetic material which heats up due to its inherent electrical losses;

application of a second and alternating electric current (S3) via the winding of one of the coils (38) surrounding the core, that acts as a magnetizer of the core (31);

analysis (S4) of the signal induced in another of the coils (37) that surrounds the core (31) and that acts as a detector of the magnetic field created inside said core (31); and determining a termination of said steps, and cancellation of application of the previous currents when the signal induced in the coil (37) that acts as a magnetic field detector drops significantly in level, the internal stress relaxation then occurring in the material of the core (31).

* * * * *

UNITED STATES PATENT AND TRADEMARK OFFICE
CERTIFICATE OF CORRECTION

PATENT NO. : 5,428,888

DATED : July 4, 1995

INVENTOR(S) : AROCA HERNANDEZ-ROS et al

It is certified that error appears in the above-identified patent and that said Letters Patent is hereby corrected as shown below:

Title page:

Item [19] "Hernandez-Ros et al."
          should be --Aroca Hernandez-Ros et al.--

Item [75] Inventors:

"Claudio A. Hernandez-Ros"
    should be --Claudio Aroca Hernandez-Ros--

"Ma Carmen S. Trujilio"
    should be --Ma Carmen Sanchez Trujilio--

"Eloisa L. Perez" should be --Eloisa Lopez Perez--

"Pedro S. Sanchez" should be --Pedro Sanchez Sanchez--

Signed and Sealed this

Twenty-fourth Day of October, 1995

Attest:

BRUCE LEHMAN

Attesting Officer          Commissioner of Patents and Trademarks